(12) United States Patent
Balakrishnan et al.

(10) Patent No.: US 9,859,301 B1
(45) Date of Patent: Jan. 2, 2018

(54) METHODS FOR FORMING HYBRID VERTICAL TRANSISTORS

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/177,941

(22) Filed: Jun. 9, 2016

(51) Int. Cl.
| | | |
|---|---|---|
| *H01L 21/00* | (2006.01) |
| *H01L 27/12* | (2006.01) |
| *H01L 29/78* | (2006.01) |
| *H01L 29/66* | (2006.01) |
| *H01L 29/16* | (2006.01) |
| *H01L 29/06* | (2006.01) |
| *H01L 29/165* | (2006.01) |
| *H01L 21/02* | (2006.01) |
| *H01L 21/84* | (2006.01) |
| *H01L 21/82* | (2006.01) |
| *H01L 21/8234* | (2006.01) |

(52) U.S. Cl.
CPC .... *H01L 27/1207* (2013.01); *H01L 21/02529* (2013.01); *H01L 21/02532* (2013.01); *H01L 21/8213* (2013.01); *H01L 21/823481* (2013.01); *H01L 21/84* (2013.01); *H01L 29/0649* (2013.01); *H01L 29/165* (2013.01); *H01L 29/1608* (2013.01); *H01L 29/66068* (2013.01); *H01L 29/66666* (2013.01); *H01L 29/7827* (2013.01)

(58) Field of Classification Search
CPC ......... H01L 29/66795; H01L 29/78696; H01L 29/66545; H01L 21/823821; H01L 29/42392
USPC .................................................. 438/105, 931
See application file for complete search history.

(56) References Cited

U.S. PATENT DOCUMENTS

| | | | |
|---|---|---|---|
| 9,443,982 B1* | 9/2016 | Balakrishnan .... | H01L 29/66742 |
| 2014/0027817 A1* | 1/2014 | Trivedi ............... | H01L 27/0623 257/192 |

\* cited by examiner

*Primary Examiner* — Andy Huynh
(74) *Attorney, Agent, or Firm* — Tutunjian & Bitetto, P.C.; Louis J. Percello (57) ABSTRACT

A method for forming a hybrid semiconductor device includes growing a stack of layers on a semiconductor substrate. The stack of layers includes a bottom layer in contact with the substrate, a middle layer on the bottom layer and a top layer on the middle layer. First and second transistors are formed on the top layer. A protective dielectric is deposited over the first and second transistors. A trench is formed adjacent to the first transistors to expose the middle layer. The middle layer is removed from below the first transistors to form a cavity. A dielectric material is deposited in the cavity to provide a transistor on insulator structure for the first transistors and a bulk substrate structure for the second transistors.

13 Claims, 7 Drawing Sheets

METHODS FOR FORMING HYBRID VERTICAL TRANSISTORS

BACKGROUND

Technical Field

The present invention generally relates to semiconductor processing and devices, and more particularly, to bulk substrate vertical transistors co-integrated with vertical transistors on insulator on a same chip.

Description of the Related Art

Vertical field effect transistors (VFETs) provide a device option for ever shrinking technology sizes. VFETs are particularly useful beyond 7 nm nodes. Some VFET circuits benefit from VFETs on insulator to minimize junction leakage and capacitance. Other VFET circuits such as electrostatic discharge (ESD) devices benefit from VFETs on a bulk substrate to improve heat dissipation.

SUMMARY

In accordance with an embodiment of the present principles, a method for forming a hybrid semiconductor device includes growing a stack of layers on a semiconductor substrate. The stack of layers includes a bottom layer in contact with the substrate, a middle layer on the bottom layer and a top layer on the middle layer. First and second transistors are formed on the top layer. A protective dielectric is deposited over the first and second transistors. A trench is formed adjacent to the first transistors to expose the middle layer. The middle layer is removed from below the first transistors to form a cavity. A dielectric material is deposited in the cavity to provide a transistor on insulator structure for the first transistors and a bulk substrate structure for the second transistors.

Another method for forming a hybrid semiconductor device includes growing a stack of layers on a semiconductor substrate, the stack of layers including a bottom layer in contact with the substrate, a middle layer on the bottom layer and a top layer on the middle layer; forming shallow trench isolation regions through the stack of layers; forming first and second transistors on the top layer; depositing a conformal liner over the first and second transistors; depositing a dielectric fill over the conformal liner; etching a trench adjacent to the first transistors to expose the middle layer; removing the middle layer from below the first transistors to form a cavity; and depositing a dielectric material in the cavity to provide a transistor on insulator structure for the first transistors and a bulk substrate structure for the second transistors.

A hybrid semiconductor device includes first and second transistors integrated on a same chip. The first transistors are formed on a stack of layers grown on a semiconductor substrate, the stack of layers including a bottom layer in contact with the substrate, a middle layer formed on the bottom layer and a top layer formed on the middle layer where the middle layer includes a dielectric material and the first transistors are formed on the top layer. The second transistors are formed on the stack of layers grown on the semiconductor substrate, the stack of layers including the bottom layer in contact with the substrate, a doped well layer formed on the bottom layer and the top layer formed on the doped well layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, methods and structures are provided for integrating vertical field effect transistors (VFETs) on bulk substrates with VFETs on insulator on a same chip. In one embodiment, fins are formed in a substrate provided on a stack of layers. Vertical transistors are formed using the fins. The vertical transistors include source and drain regions connected by the fins where the fins function as a device channel. Trenches are formed in regions adjacent to some of the vertical transistors. An etch process selectively removes material from below some of the vertical transistors to create tunnel space. The tunnel space is filled with a dielectric material to provide a semiconductor-on-insulator (SeOI) structure, after the fact, and integrated with the bulk vertical transistors previously fabricated.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
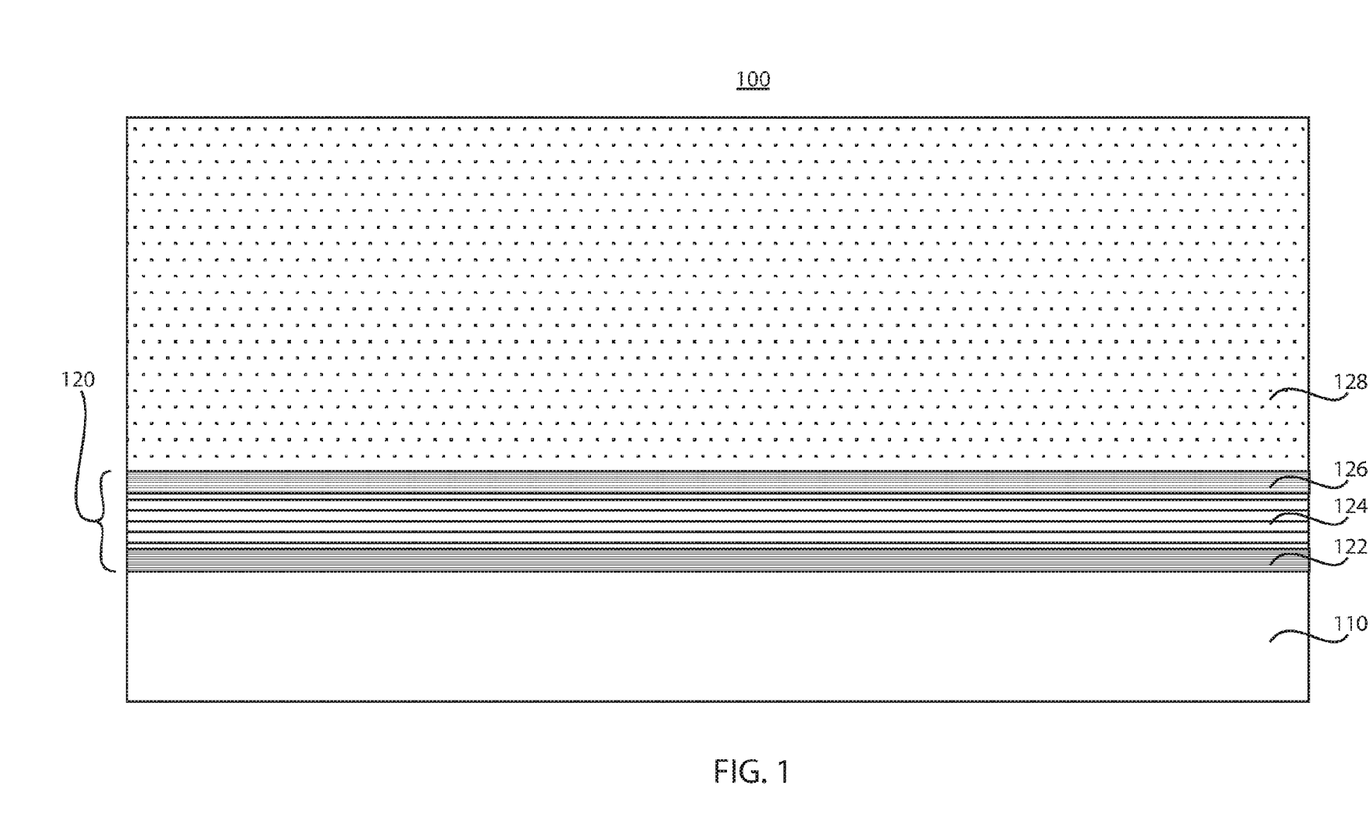
FIG. 1 is a cross-sectional view showing a stack of layers formed on a substrate and including an additional semiconductor layer for forming vertical transistors in accordance with the present principles.

Referring now to the drawings in which like numerals represent the same or similar elements and initially to FIG. 1, a cross-sectional side view of a device 100 is shown in accordance with an exemplary embodiment. In one or more embodiments, a base substrate 110 may be a semiconductor. The substrate 110 may be crystalline (e.g., monocrystalline). The substrate may be essentially (i.e., except for contaminants) a single element (e.g., silicon), primarily a single element (i.e., with doping), for example, silicon (Si) or germanium (Ge), or the substrate may be a compound semiconductor, for example, a III-V compound semiconductor (e.g., GaAs), SiC, or SiGe.

The substrate 110 may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). In one or more embodiments, the substrate 110 may be a silicon wafer. In various embodiments, the substrate is a single crystal silicon wafer. A single crystal silicon substrate may have a <100> or a <111> surface.

In one or more embodiments, a stack of layers 114 is grown on the substrate 110. The stack of layers 114 may include three or more layers. In one embodiment, the stack of layers 114 includes a bottom layer 122 formed on the substrate 110, a middle layer 124 formed on the bottom layer 122 and a top layer 126 formed on the middle layer 124. The stack of layers 114 (e.g., the bottom layer 122, the middle layer 124 and the top layer 126) are preferably epitaxially grown to maintain the crystal structure of the substrate 110 and provide a crystal structure for the formation of a semiconductor layer 128.

In one embodiment, the bottom layer 122, the middle layer 124 and the top layer 126 are epitaxially grown. The bottom layer 122 and the top layer 124 may include a same material. Middle layer 124 includes a different material that is selectively etchable with respect to the material(s) of bottom layer 122 and top layer 126. In one embodiment, the top layer 126 and the bottom layer 122 include silicon (Si), and in particular, Si:C (carbon doped silicon), and the middle layer 124 includes silicon germanium (SiGe). The semiconductor layer 128 may include crystalline Si, although other semiconductor materials may be employed, e.g., SiGe.

Epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of device. When Si:C is epitaxially grown, the Si:C layer may include carbon in the range of 0.2 to 3.0%. When SiGe is epitaxially grown, the SiGe may have germanium content in the range of 5% to 80%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxial grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Figure 2:
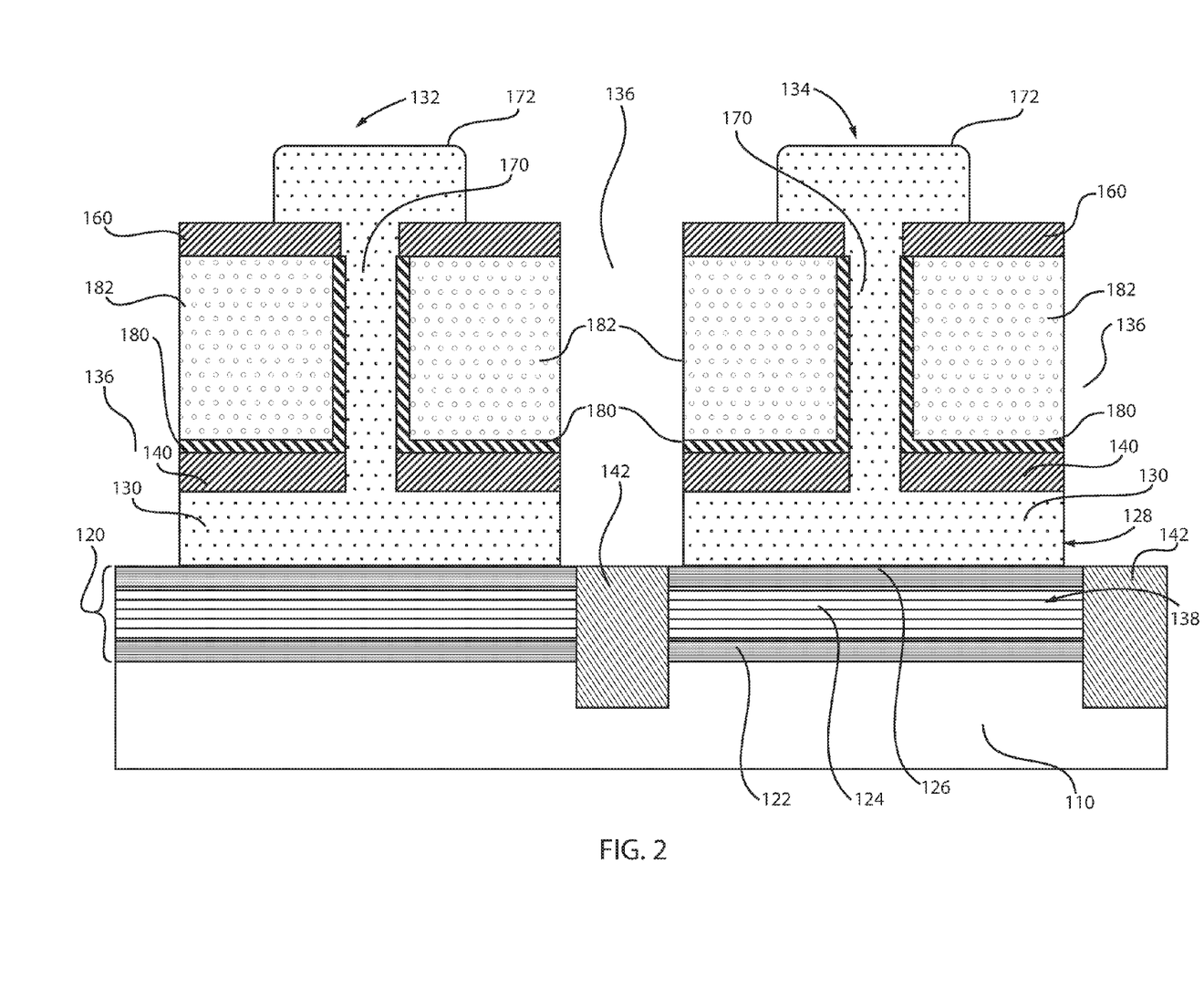
FIG. 2 is a cross-sectional view showing a structure of FIG. 1 having vertical transistors formed with a shallow trench isolation region therebetween in accordance with the present principles.

Referring to FIG. 2, vertical transistors 132 and 134 are fabricated over the stack of layers 120 using the semiconductor layer 128. The lower portion of the semiconductor layer 128 is doped to form a source/drain region 130 from the bulk material of the semiconductor layer 128. The semiconductor layer 128 may also be doped in-situ (during its fabrication). The source/drain regions 130 may be n-doped or p-doped. The source/drain regions 130 may have a dopant concentration in the range of about $1 \times 10^9$ to about $1 \times 10^{22}$ dopant atoms/cm$^3$. In various embodiments, the source/drain regions 130 may form a source or a drain for a vertical FinFET device. It should be noted that a source and a drain may be interchanged, where the drain may be in the substrate below a vertical fin and the source may be formed on the top of a vertical fin.

A patterned etch process may be performed to etch through the stack of layers 120 into the substrate 110 to provide shallow trenches. The shallow trenches are filled with a dielectric material and planarized to form shallow trench isolation (STI) regions 142. STI regions 142 are not formed is predetermined locations where devices on insulators are to be fabricated. For example, an STI 142 is omitted on a left side of the VFET 132.

One or more layers in the stack of layers 120 may be doped to form a doped well 138. The doped wells may be formed from the middle layer 124 for VFETs 134 that will be formed on bulk materials. The doped well 138 may be n-doped or p-doped with the dopant polarity opposite to the dopant polarity of the source/drain 130. In various embodiments, the doped well 138 may be formed by implantation of dopants, diffusion of dopants or in-situ doping.

The formation of the vertical transistors 132 and 134 includes a bottom spacer layer 140, which may be formed on an exposed surface of the semiconductor layer 128 followed by a dummy gate material and a top spacer layer. The bottom spacer layer 140 may be a dielectric material, for example, silicon oxide (SiO), silicon nitride (SiN), boron nitride (BN), silicon boron carbon nitride (SiBCN), or silicon oxide carbon nitride (SiOCN). The bottom spacer layer 140 may be deposited by chemical vapor deposition (CVD), physical layer deposition (PVD), atomic layer deposition (ALD), as well as modifications thereof, such as plasma enhanced (e.g., PECVD), high density plasma (HDPCVD), metal organic (e.g., MOCVD), electron beam (e.g., EB-PVD), low pressure (e.g., LPCVD), etc., or combinations thereof. The bottom spacer layer 140 may act as an etch stop layer during fabrication processes.

In one or more embodiments, a dummy gate layer (not shown) may be formed on the bottom spacer layer 140, which may provide a sacrificial template for forming a vertical channel and a gate structure on a channel. In various embodiments, the dummy gate layer (not shown) may be amorphous silicon (a-Si) or polycrystalline silicon (p-Si).

In one or more embodiments, a top spacer layer 160 may be formed on the dummy gate layer, where the top spacer layer 160 may be the same material as the bottom spacer layer 140. The top spacer layer 160 may be a dielectric material, for example, silicon oxide (SiO), silicon nitride (SiN), silicon oxynitride (SiON), or boron nitride (BN), silicon boron carbon nitride (SiBCN), or silicon oxide carbon nitride (SiOCN).

The bottom spacer layer 140, dummy gate layer and top spacer layer 160 may form a channel layer stack, where the channel layer stack may provide a template for defining a vertical channel and/or forming a gate structure.

Fin trenches are formed through the top spacer layer 160, dummy gate layer and bottom spacer layer 140 to the surface of the bottom source/drain region 130 in accordance with an exemplary embodiment. A photo mask layer (not shown) may be a temporary resist (e.g., PMMA) that may be deposited on a dielectric layer formed over the device, patterned, and developed. The photo mask layer may be a positive resist or a negative resist. One or more openings may be patterned in the photo mask layer for forming one or more fin trenches down to the bottom source/drain regions 130. The size and placement of the openings in the photo mask layer may define the width, length, and pitch of the one or more openings, and thereby, the width, length, and pitch of the one or more vertical fins.

In one or more embodiments, one or more suitable etching processes may be utilized to remove material from the dielectric layer (not shown), top spacer layer 160, dummy gate layer (not shown), and bottom spacer layer 140, and to form fin trenches, where the underlying material may act as an etch stop layer for each of the one or more etching processes sequentially utilized to form the fin trench(es). In various embodiments, the fin trenches may be etched using a directional reactive ion etching (RIE) process.

In one or more embodiments, after formation of the one or more fin trench(es), at least a portion of a channel layer stack inside the one or more fin trenches may be oxidized to form a dummy layer liner (not shown). The dummy layer liner may surround the trench at the level of the dummy gate layer. The dummy layer liner may protect the interface between the vertical fin 170 and the dummy gate layer during epitaxial growth and/or subsequent processes, where the dummy layer liner may avoid an amorphous crystal structure of the dummy gate layer interfering with the epitaxial growth to grow the fins 170.

Vertical fins 170 may be formed within each of the fin trenches. The vertical fins 170 may be formed by epitaxial growth from the exposed surface of the bottom source/drain region 130. In various embodiments, the bottom source/drain region 130 may have a <100> or <111> crystal orientation, and the vertical fins 170 may be formed with the same crystal orientation as the bottom source/drain region 130. The bottom source/drain region 130 may have the same crystal orientation as the bulk substrate 110 or a layer (126) on the substrate 110. The vertical fins 170 are formed to act as a channel for the VFETs 132, 134.

In one or more embodiments, the vertical fins 170 may be silicon, (Si), germanium (Ge), silicon-germanium (SiGe), gallium arsenide (GaAs), indium gallium arsenide (InGaAs), indium arsenide (InAs), or indium aluminum arsenide (InAlAs). The vertical fins 170 may be single crystal epitaxially grown on the bottom source/drain region 130. The vertical fins 170 may extend above the surface of the top spacer layer 160 and expand laterally due to different growth rates of the different crystal faces. In particularly useful embodiments, Ge is included in the fins 170 to obtain electron and hole mobility benefits.

In one or more embodiments, the one or more vertical fins 170 may have a width in the range of about 6 nm to about 20 nm, or may have a width in the range of about 8 nm to about 15 nm, or may have a width in the range of about 10 nm to about 12 nm, and a height in the range of about 30 nm to about 300 nm, or about 50 nm to about 150 nm. In one embodiment, the vertical fin body 170 is undoped. In another embodiment, the vertical fin body 170 is lightly doped, e.g., dopant concentration less than $1 \times 10^{19}/cm^3$). A planarization process, e.g., chemical mechanical polishing (CMP) may be performed to planarized the fin material.

A doped material forming a top source/drain 172 may be formed on the vertical fins 170. The top source/drain 172 may be formed by epitaxial growth on the exposed surface of the vertical fins 170, such that the vertical fins 170 and the top source/drain 172 have the same crystal orientation. The top source/drain 172 may be n-doped or p-doped. The top source/drain 172 may be doped in-situ during deposition of the top source/drain 172. In various embodiments, the locations of the source and drain of the vertical transistor may be reversed such that the drain is on the top of a vertical fin, while the source is at the bottom. The source may, therefore, be at the bottom or the top.

The doped material for top source/drain 172 is formed before removing the dummy gate layer and dummy gate liners are removed with top spacer layer 160 in place. The dummy gate layer may be removed by a wet chemical etch or other etch process.

After removing dummy layer liners, a gate dielectric layer 180 may be formed on the vertical fin 170 and bottom spacer layer 140 where the gate dielectric layer 180 may be conformally deposited. The gate dielectric layer 180 may be conformally deposited by atomic layer deposition (ALD) and/or CVD. The gate dielectric layer 180 may be silicon oxide, silicon nitride, silicon oxynitride, and/or a high-k material, including but not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k dielectric material may further include dopants such as lanthanum and/or aluminum. The stoichiometry of the high-k dielectric material may vary. In various embodiments, the gate dielectric layer 180 may have a thickness in the range of about 1.5 nm to about 2.5 nm.

In one or more embodiments, a gate conductor 182 may be deposited over the gate dielectric layer 180. The gate conductor 182 may include a work function layer (not shown) that may be conformally deposited by ALD and/or CVD. The work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof. The work function layer may have a thickness in the range of about 1 nm to about 11 nm, or may have a thickness in the range of about 2 nm to about 5 nm.

In one or more embodiments, the gate conductor 182 may further include a thin a gate metal layer (not shown) which may be formed on the work function layer, where the gate metal layer may include a thin layer conformally deposited on the work function layer. The gate conductor 182 is deposited and patterned to form a gate electrode that may include tungsten (W), aluminum (Al), titanium nitride (TiN), cobalt (Co), etc. or combinations thereof. In various embodiments, the gate dielectric layer 180 and the gate conductor 182 (and layers thereof) are formed about the vertical fins 170. In various embodiments, the gate structure may wrap around three sides or four sides of the vertical fin.

In one or more embodiments, the gate structure (e.g., gate dielectric 180, gate conductor 182), top spacer layer 160, bottom spacer layer 140 and bottom source/drain region 130 may be patterned and etched to define the VFETs 132, and 134. In various embodiments, each layer may be removed by a suitable directional etching process (e.g., RIE), where the underlying layer may act as an etch stop layer until trenches 136 are formed.

In one or more embodiments, the gate conductor 182 may include tungsten (W). In various embodiments, the gate conductor 182 may extend laterally to allow formation of a metal contact to the gate conductor 182. The gate conductor 182 may be electrically isolated from the bottom source/drain region 130 by bottom spacer layer 140.

Other methods may be employed to form vertical transistors 132, 134. In some embodiments, device types other than vertical transistor may be employed, for example, horizontal transistors or other components.

Figure 3:
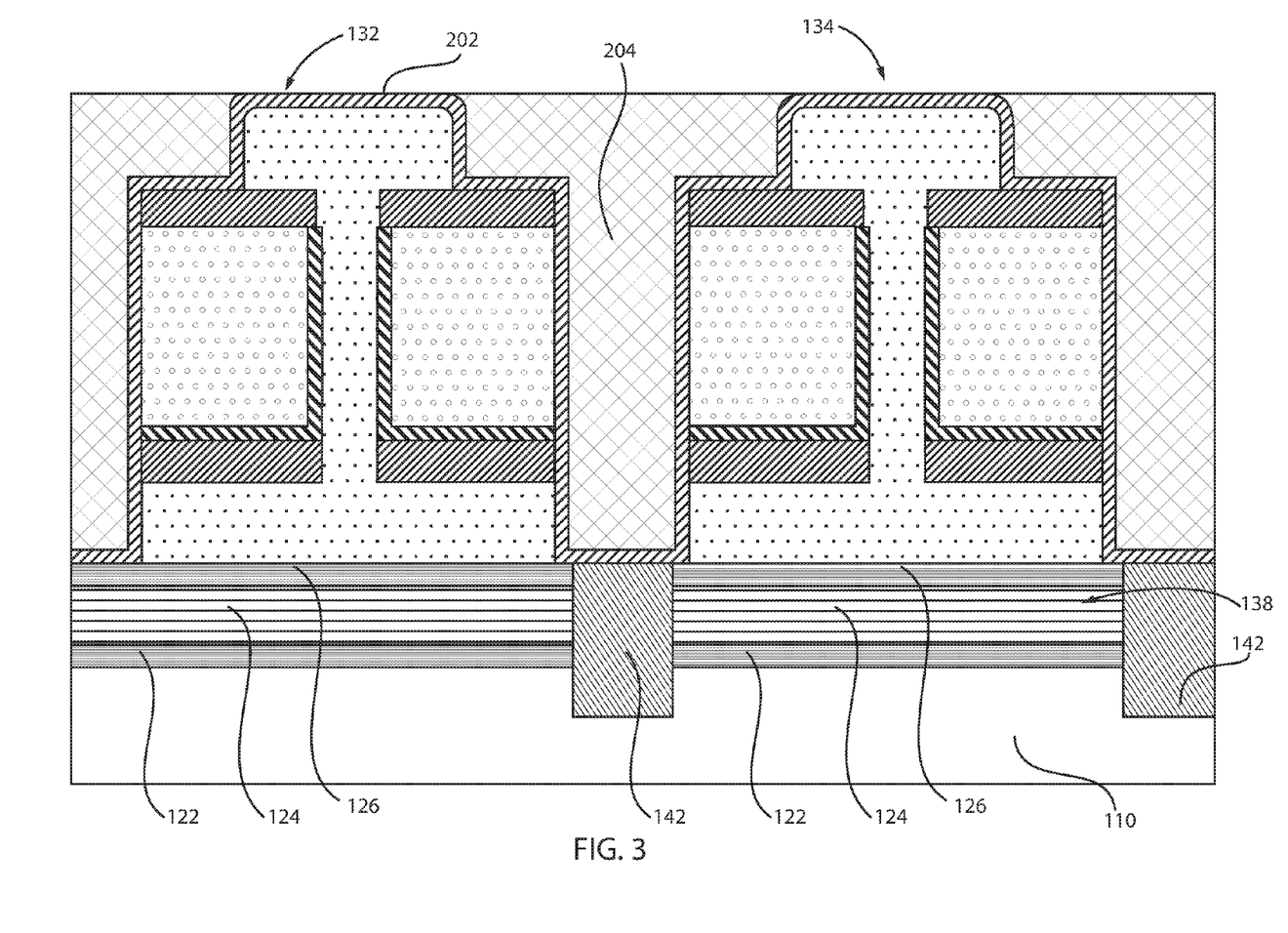
FIG. 3 is a cross-sectional view showing the structure of FIG. 2 having a liner and a dielectric fill formed over the vertical transistors to form a protective barrier in accordance with the present principles.

Referring to FIG. 3, a conformally deposited dielectric liner 202 is formed over and between the transistors 132, 134. The conformally deposited liner 202 may include a nitride, such as, e.g., SiN, BN, SiON, SiBN, SiBCN, SiOCN, etc., although any suitable combination of those materials may also be employed. The liner 202 may be deposited by chemical vapor deposition (CVD), physical layer deposition (PVD), atomic layer deposition (ALD), as well as modifications thereof, such as plasma enhanced (e.g., PECVD), metal organic (e.g., MOCVD), electron beam (e.g., EB-PVD), low pressure (e.g., LPCVD), etc., or combinations thereof.

A dielectric fill 204 is deposited over the liner 202. The dielectric fill 204 fills in the space between neighboring structures, including VFETs 132 and 134, and provides electrical insulation between devices and components. The dielectric fill 204 may include an oxide, although other suitable dielectric materials may be employed. The dielectric fill 204 may be deposited by spin-on, CVD, flowable oxide, or any suitable deposition technique. The dielectric fill 204 is planarized down to upper most portions of the liner 202. The planarization process may include a chemical mechanical polish (CMP) process. A treatment process such as thermal annealing or UV (ultraviolet) exposure may be performed after the deposition and/or after the CMP of the dielectric fill 204.

Figure 4:
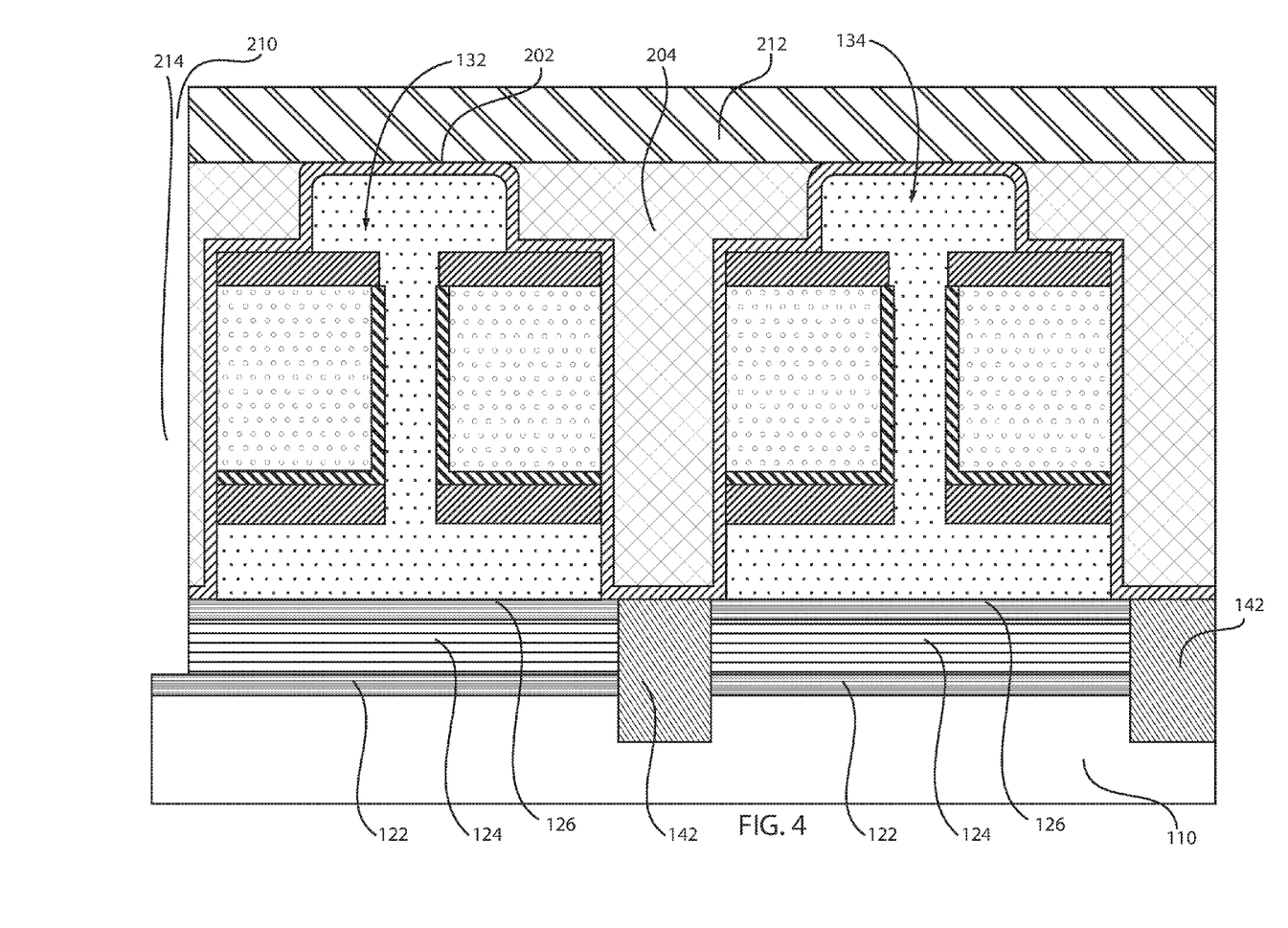
FIG. 4 is a cross-sectional view showing the structure of FIG. 3 having a mask for etching trenches to expose a middle layer of the stack of layers in accordance with the present principles.

Referring to FIG. 4, a mask layer 212 is deposited over the planarized surface of the dielectric fill 204 and the exposed liner 202. The mask layer 212 may include any suitable material to protect the underlying layers during a directional etch process. In useful embodiments, the mask layer 212 may include a photoresist material, a dielectric material or any other suitable mask materials. The mask layer 212 may be spun on, deposited (e.g., CVD) or formed by any other formation method.

The mask layer 212 is patterned to open up holes 210 in the mask layer 212 at positions where trenches 214 are to be formed. The patterning may be performed using a lithographic process. A directional etch, such as, e.g., a RIE, is performed to etch trenches 214 through the dielectric fill 204 through a horizontal portion of the liner 204 and through the top layer 126 to expose the middle layer 124. The middle layer 126 may also be etched through, stopping on the bottom layer 122.

Figure 5:
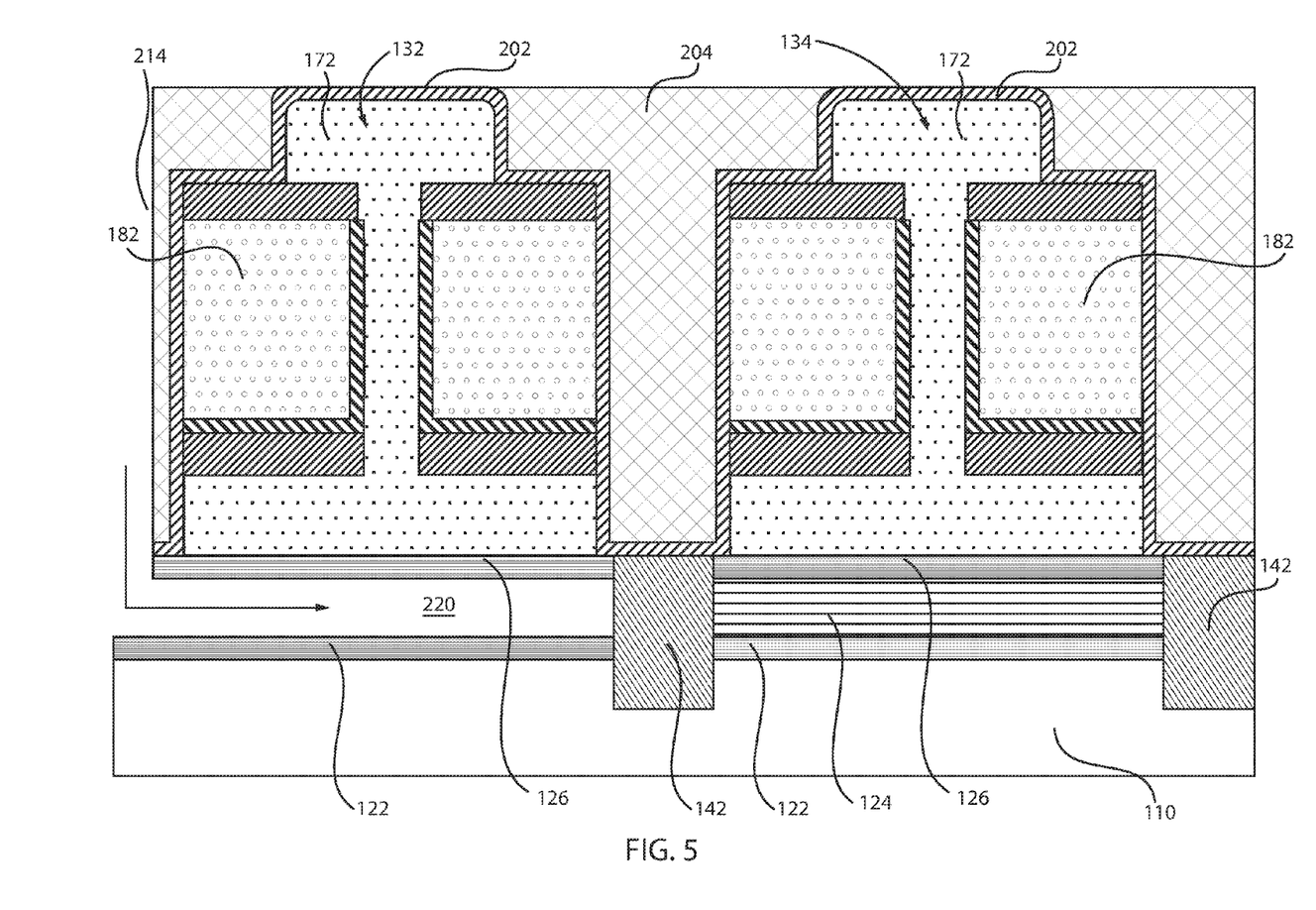
FIG. 5 is a cross-sectional view showing the structure of FIG. 4 with the middle layer of the stack of layers removed below a transistor to form a cavity in accordance with the present principles.

Referring to FIG. 5, the mask layer 212 is removed by an etch or planarization process. The device is subjected to a selective etch process to remove the middle layer 124 through the trench 214. The selective process may include a wet or dry etch that selectively removes the material of the middle layer 124 relative to the top layer 126, the bottom layer 122, the dielectric fill 204, the liner 202 and the STI 142. In one embodiment, the middle layer 124 includes SiGe and the top and bottom layers include Si:C. The SiGe can be selectively removed by a wet etch, e.g., a hydroperoxide etch or an acid etch, e.g., HCl, etc.

The VFETs 132, 134 (or other devices) are protected for the etch by a protective envelope formed by the liner 202 and dielectric fill 204 and the in the case of device 132, the top layer 126. The selective etch process removes the material of the middle layer 124 up to STI region 142. This forms a tunnel or cavity 220 below device 132.

Figure 6:
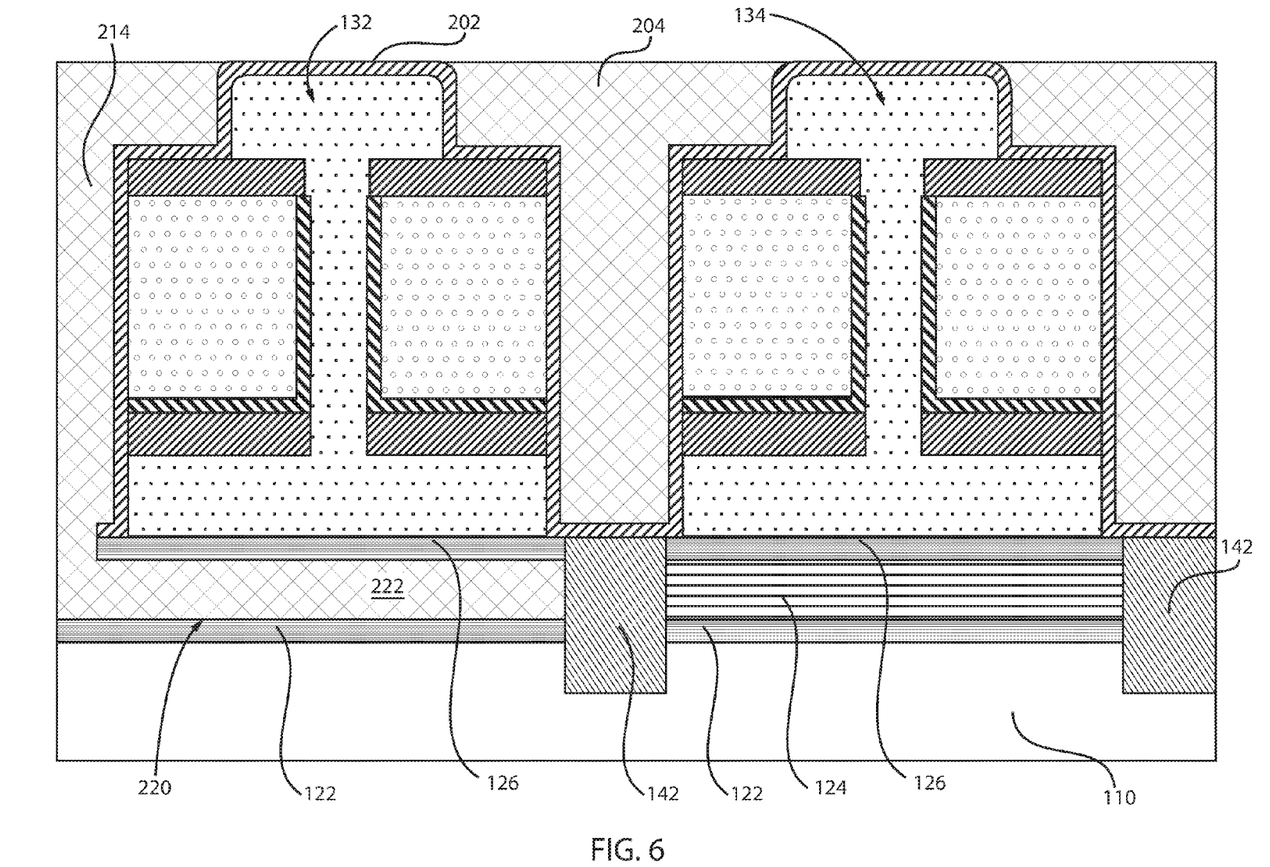
FIG. 6 is a cross-sectional view showing the structure of FIG. 5 with the cavity filled with dielectric material in accordance with the present principles.

Referring to FIG. 6, another dielectric fill process is performed to fill the cavity 220 with a dielectric material 222. The dielectric material 222 may be deposited by a PVD process, a CVD process or any process capable of filling the cavity 220 and trench 214. In one embodiment, the dielectric material 222 may include a flowable oxide. A planarization process is performed (e.g., CMP) to planarize a top surface of the device.

The VFET 132 is now isolated from the substrate 110 by the dielectric material 222, and the VFET 134 remains in contact with semiconductor material through layers 126, 124, 122 to the substrate 110 to support bulk substrate contact (e.g., to improve heat dissipation, etc.). In this way, devices formed on insulator, e.g., VFETs 132, are integrated with devices on bulk, e.g., VFETs 134, on a same chip or substrate 110. This forms a hybrid vertical transistor device or chip.

Processing continues with the formation of an interlevel dielectric (ILD) layer. The ILD may include an oxide or other suitable dielectric material. Middle-of-the-line contacts may then be formed, where the gate, source and drain contacts may be made to the transistor components. One or more trenches may be formed through dielectric fill 204 and liner 202 to form contact holes that land on the gate conductor 182 and the top source/drain regions 172. Source or drain contacts may be self-aligned by removing fill 240 to form the contacts holes. The contact holes may extend vertically down to the gate conductor 182 and the top source/drain region 172 to form metal contacts for back-end-of-the-line (BEOL) electrical connections.

In various embodiments, the contact holes may be filled with a barrier layer (not shown) and/or a metal contact fill. The barrier layer may be selectively formed in the contact holes to the top source/drain region 172. In one or more embodiments, a metal contact fill for contacts may be tungsten (W), aluminum (Al), or copper (Cu) or other suitable materials. In various embodiments, the barrier layer may be titanium nitride (TiN), tantalum nitride (TaN), hafnium nitride (HfN), niobium nitride (NbN), tungsten nitride (WN), or combinations thereof, where the barrier layer may prevent diffusion and/or alloying of the metal contact fill material with the top source/drain region 172 and/or gate conductor 182.

Figure 7:
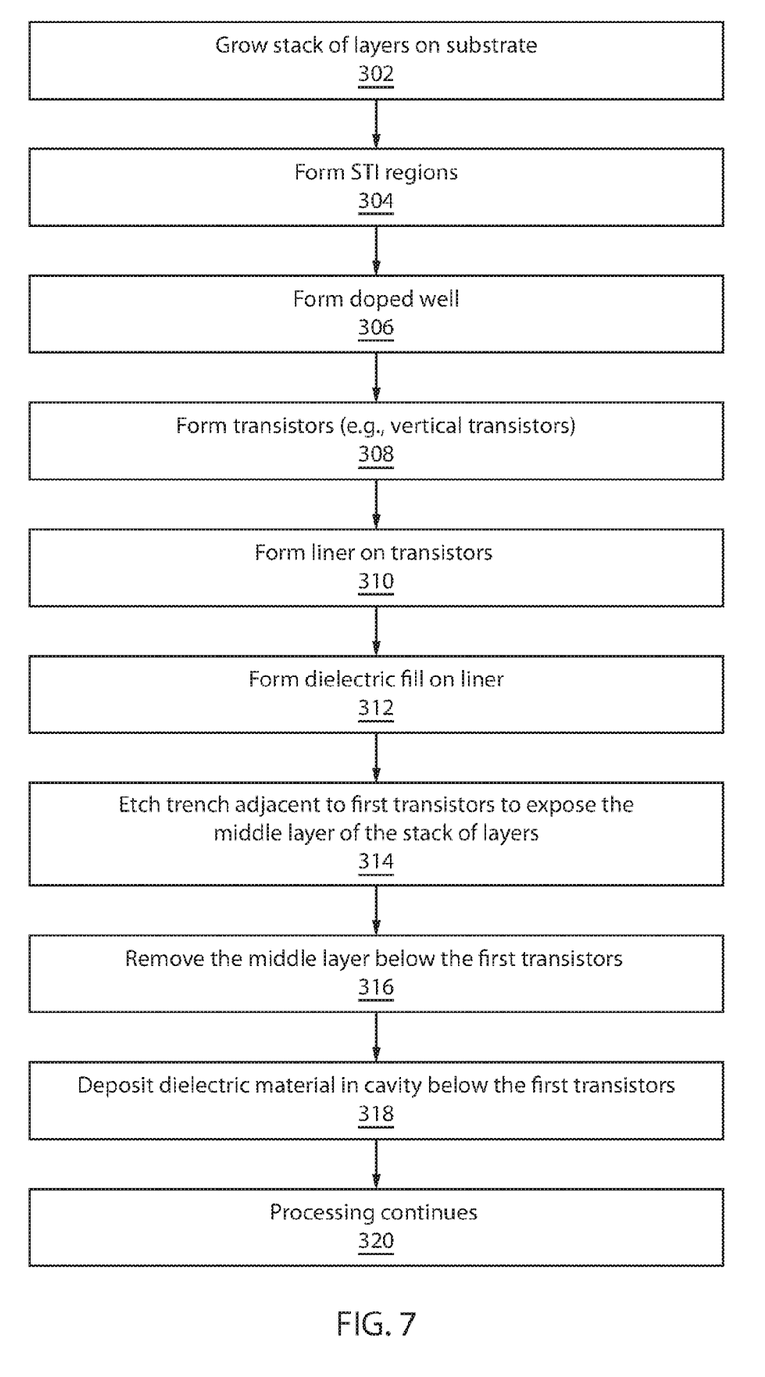
FIG. 7 is a block/flow diagram showing methods for forming a hybrid semiconductor device in accordance with the present principles.

Referring to FIG. 7, methods for forming a hybrid semiconductor device are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, a stack of layers are grown on a semiconductor substrate. The stack of layers includes a bottom layer in contact with the substrate, a middle layer on the bottom layer and a top layer on the middle layer. In one embodiment, the stack of layers is epitaxially grown and may include a Si:C layer as the bottom layer, a SiGe layer as the middle layer and a Si:C as the top layer. A semiconductor layer may be formed on the stack of layers to form a bottom source/drain region and/or fins (channels) for vertical transistors. The fins may be grown or etched from the semiconductor layer.

In block 304, shallow trench isolation (STI) regions are formed through the stack of layers. In block 306, a doped well may be formed in the middle layer for bulk transistors by doping the middle layer. In block 308, transistors are formed on the top layer. The transistors may include vertical transistors although any other transistor or component may be employed. In block 310, a conformal liner is deposited over the first and second transistors. In block 312, a dielectric fill is deposited over the conformal liner. In block 314, a trench is etched adjacent to first transistors to expose the middle layer. In block 316, the middle layer is removed from below the first transistors to form a cavity. The middle layer may be removed up to the shallow trench isolation region.

In block 318, a dielectric material is deposited in the cavity to provide a transistor on insulator structure for the first transistors and a bulk substrate structure for the second transistors. The dielectric material in the cavity may include a flowable oxide to fill the cavity. In block 120, processing continues with the formation of contacts and other structures.

Having described preferred embodiments for hybrid vertical transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a hybrid semiconductor device, comprising:
    growing a stack of layers on a semiconductor substrate, the stack of layers including a bottom layer in contact with the substrate, a middle layer on the bottom layer and a top layer on the middle layer;
    forming first and second transistors on the top layer;
    depositing a protective dielectric over the first and second transistors;
    forming a trench adjacent to the first transistors to expose the middle layer;
    removing the middle layer from below the first transistors to form a cavity; and
    depositing a dielectric material in the cavity to provide a transistor on insulator structure for the first transistors and a bulk substrate structure for the second transistors.

2. The method as recited in claim 1, wherein growing the stack of layers includes epitaxially growing a Si:C layer as the bottom layer, a SiGe layer as the middle layer and a Si:C as the top layer.

3. The method as recited in claim 1, wherein the first and second transistors include vertical transistors.

4. The method as recited in claim 1, further comprising forming shallow trench isolation regions through the stack of layers between the first and second transistors.

5. The method as recited in claim 4, wherein removing the middle layer from below the first transistors to form the cavity includes removing the middle layer up to the shallow trench isolation region.

6. The method as recited in claim 1, further comprising forming a doped well in the middle layer for the second transistors.

7. The method as recited in claim 1, wherein depositing the dielectric material in the cavity includes depositing a flowable oxide to fill the cavity.

8. A method for forming a hybrid semiconductor device, comprising:
    growing a stack of layers on a semiconductor substrate, the stack of layers including a bottom layer in contact with the substrate, a middle layer on the bottom layer and a top layer on the middle layer;
    forming shallow trench isolation regions through the stack of layers;
    forming first and second transistors on the top layer;
    depositing a conformal liner over the first and second transistors;
    depositing a dielectric fill over the conformal liner;
    etching a trench adjacent to the first transistors to expose the middle layer;
    removing the middle layer from below the first transistors to form a cavity; and
    depositing a dielectric material in the cavity to provide a transistor on insulator structure for the first transistors and a bulk substrate structure for the second transistors.

9. The method as recited in claim 8, wherein growing the stack of layers includes epitaxially growing a Si:C layer as the bottom layer, a SiGe layer as the middle layer and a Si:C as the top layer.

10. The method as recited in claim 8, wherein the first and second transistors includes vertical transistors.

11. The method as recited in claim 8, wherein removing the middle layer from below the first transistors to form the cavity includes removing the middle layer up to the shallow trench isolation region.

12. The method as recited in claim 8, further comprising forming a doped well in the middle layer for the second transistors.

13. The method as recited in claim 8, wherein depositing the dielectric material in the cavity includes depositing a flowable oxide to fill the cavity.

* * * * *